United States Patent [19]

Audaire et al.

[11] Patent Number: 5,008,541
[45] Date of Patent: Apr. 16, 1991

[54] MONOLITHIC DETECTION OR INFRARED IMAGING STRUCTURE AND ITS PRODUCTION PROCESS

[75] Inventors: Luc Audaire, Grenoble; Jean C. Peuzin, Herbeys; Bernard Schaub, Lans-En-Vercors, all of France

[73] Assignee: Commissariat Energie Atomique, Paris, France

[21] Appl. No.: 438,768

[22] Filed: Nov. 17, 1989

[30] Foreign Application Priority Data

Nov. 29, 1988 [FR] France .................. 88 15581

[51] Int. Cl.⁵ .......................... H04N 5/33; G01J 5/10
[52] U.S. Cl. .................................. 250/338.3; 250/332; 250/349
[58] Field of Search ................. 250/338.3, 338.4, 349, 250/332, 333, 370.08

[56] References Cited

U.S. PATENT DOCUMENTS

| | | | |
|---|---|---|---|
| 3,846,820 | 11/1974 | Lampe et al. | 250/338.3 |
| 3,973,146 | 8/1976 | Arnold et al. | 357/26 |
| 4,341,012 | 7/1982 | Fripp et al. | 250/332 |
| 4,769,545 | 9/1988 | Fraden | 250/338.3 |
| 4,792,682 | 12/1988 | Endou et al. | 250/338.3 |

FOREIGN PATENT DOCUMENTS 0173368  3/1986  European Pat. Off.
8801793  3/1988  PCT Int'l Appl.

OTHER PUBLICATIONS

IEEE International Symposium On Applications of Ferroelectrics (R. Watton), 1986.
Meixner et al., "Infrared Sensors Based on the Pyroelectric Polymer Polyvinylidene Fluoride (PVDF)", Siemens Forschungs 15 (3), 1986, pp. 105–114.

Primary Examiner—Carolyn E. Fields
Attorney, Agent, or Firm—Cesari and McKenna

[57] ABSTRACT

The structure comprises an electrically and thermally insulating polyimide layer, infrared sensors which are insulated from one another and have a polyvinyl pyroelectric film, whose face in contact with the polyimide is equipped with two comb-shaped electrodes, whose teeth are imbricated, the pyroelectric film being polarized in a plane parallel to the film and in directions parallel and perpendicular to the comb teeth, an integrated circuit having a face in contact with the polyimide layer, equipped with the reading circuit, and electric contact zones completely traverse the polyimide layer and connect the electrodes of each sensor to a reading circuit.

12 Claims, 4 Drawing Sheets

MONOLITHIC DETECTION OR INFRARED IMAGING STRUCTURE AND ITS PRODUCTION PROCESS

BACKGROUND OF THE INVENTION

The invention relates to a monolithic or integrated structure for detection or infrared imaging, as well as to its production process. It makes it possible to produce industrially on a large scale pyroelectric infrared cameras, whose complexity and spacing of the elementary sensors are directly compatible with a display on an existing standard television screen.

At present, the development of civil applications of infrared imaging, such as medical applications and the monitoring of areas with a high fire risk is technically limited by the lack of an industrial technology concerning inexpensive, general public detectors.

Infrared detection means are based on the property of a certain number of dielectric materials of having a spontaneous polarization, i.e. a residual internal electric field, which varies as a function of the temperature. This property is the pyroelectric effect.

The temperature variation is proportional to the energy of the incident photon signal. For a given energy, it increases with the decrease in the thermal capacity of the detector, which leads to the use of a thin pyroelectric layer for minimizing the detection volume.

The polarization variation is manifested at the detector terminals by a charge variation. Two metal electrodes deposited on the surface of the dielectric make it possible to constitute a capacitor, at whose terminals it is possible to measure the voltage when it is read by a high impedance input circuit of the MOS transistor type. This voltage of a few millivolts is proportional to the incident energy variation.

The generally used pyroelectric materials are given in the article "Pyroelectric Devices and Materials" by R. W. Watermoore, Rep. Prog. Phys. 49, 1986, pp 1335-1386. Reference is made among these materials to polymers or copolymers of the polyvinylidene fluoride type.

FIG. 1 diagrammatically shows in perspective, a first embodiment of a known infrared detector, more particularly described in "Ferroelectrics for infrared detection and imaging" by R. Watton, IEEE Int. Symp. on Applications of Ferroelectrics, June 1986, Bethlehem, U.S.A. In this detector, the detecting part is connected to the reading circuit by a hybridization process.

As shown in FIG. 1, each sensor 2 of the detector has two electrodes 4 and 6 placed on opposite faces of the pyroelectric material 8. The polarization vector 9 must be perpendicular to the structure of the electrodes 4 and 6. A thermal insulating material 12 insulates each sensor 2 from a soldered joint on metal stud 14 for hybridization. For each sensor, a metallization 16 then ensures the contact between the electrode 6 and the soldered joint 14.

The sensors 2 constituting the elementary points in imaging are thermally and mechanically insulated or isolated from one another by the etching or pyroelectric materials 8, conductor 6 and insulant 12. This insulation or isolation carries the reference 15.

The reading of the voltage on electrode 6 resulting from the interaction of an infrared radiation 17 with the detector takes place via control lines 22, in an integrated circuit 18 made from silicon, with the aid of a single input amplifier stage 20, the electrode 4 common to all the sensors 2 serving as a reference for all these sensors. To simplify the description and drawings, the integrated circuit is only shown in its functional form.

This arrangement of the detector prevents a gain exceeding 100. Moreover, this technology requires a large number of masks and in particular six masking levels for producing the detecting part.

A more recent construction of a detection device is diagrammatically shown in perspective in FIG. 2. This is more particularly described in the article "Type II pyroelectric detectors" by A. Hadni, Infrared Physics, vol. 27, No. 1, pp 17-23, 1987.

In this construction, the two electrodes 4a and 6a of each sensor 2a are placed on the same face of the pyroelectric material 8a and are respectively connected to the reading circuit 18a by two soldered joints 14a, 14b. In this structure, the polarization vector 9a must be parallel to the plane of the electrodes 4a, 6a. The detection-useful zone, indicated by mixed lines and designated 24, is approximately the volume having as its base the surface between the electrodes 4a, 6a and whose height is equal to the distance d between these electrodes.

This structure is preferable to that shown in FIG. 1, because there is no common electrode, which is not well supported in the insulation zones 15 between each sensor. The common electrode is consequently fragile and unreliable. Moreover, the two electrodes 4a, 6a are located on the hydridization face and make it possible for each sensor 2a to be read by a differential amplifier 20a.

It is known that this type of amplifier eliminates the noise occurring in the common mode, such as the piezoelectric noise and thus, for each sensor, allows an amplification with a gain which can reach 1000.

In this embodiment, metallizations 16a and 16b respectively ensure the electrical contact between electrodes 4a, 6a and soldered joints 14a, 14b. Moreover, a thermal insulating material 12a insulates each sensor 2a from its two soldered joints. Once again, the thermal and mechanical insulation 15a of the sensors is ensured by etching the insulating layer 12a and the pyroelectric layer 8a.

The two aforementioned embodiments suffer from a certain number of disadvantages.

Thus, the metal connections 16, 16a, 16b between the sensor and the integrated circuit constitute thermal points limiting the temperature rise of the detector and therefore reducing by the same amount the voltage variation, whereas the reading noise is not reduced. Thus, the detection of the infrared signal is greatly deteriorated.

Moreover, the topological constraints linked with the construction of the soldered joints do not make it possible to envisage a sensor size smaller than 40 μm. This size exceeds the size of the diffraction spot of the optics associated with the detector, so that the sensors limit the angular shooting resolution.

Moreover, the hybridization operation is not a standard technological step in microelectronics. Moreover, the methods usable for the deposition and etching of electrodes do not make it possible to move them together to a distance d (FIG. 2), which is less than about 10 micrometers. Therefore the capacity of the sensor is low compared with the input capacity of the reading circuit. Therefore the pyroelectric voltage supplied by the detector is reduced.

In addition, the cavity 26 beneath each sensor 2a of FIG. 2 contains traces of the products used during the production process. These products remain active when the detection circuit is finished, which leads to a reduction in the life of said device.

These disadvantages apply no matter which pyroelectric material is used. However, they are much more marked when using as the sensitive material a polymer or copolymer of the polyvinylidene fluoride type. In particular, the hybridization operation excessively raises the temperature of the polymer and reduces its performance characteristics.

Moreover, the metal deposit necessary for producing the electrodes on a very thin polymer film induces mechanical constraints therein, which deform the film and the metal layer. The thus deformed metal layer becomes unsuitable for the production of etched electrodes using microelectronic methods.

In conclusion, the hybridization method of sensors with an integrated circuit does not make it possible to produce detectors or infrared imaging means, which are reproducible and reliable and have a high integration density. The integration of the reading circuits and sensors is dealt with in a publication entitled "Fully-integrated ZnO on silicon pyroelectric infrared detector array" by D. L. Polla et al, Proceeding IEDM, 1984, pp 282-284.

The technology described in this article is not suitable for high density integration. Thus, the reading circuit and the sensor connected thereto are not located in superimposed manner as described relative to FIGS. 1 and 2. Moreover, the thickness reduction of the silicon necessary for the detection cannot be obtained for a small spacing less than 10 micrometers.

SUMMARY OF THE INVENTION

The present invention relates to a monolithic detection or infrared imaging structure, as well as to its production process, making it possible to obviate the aforementioned disadvantages. In particular, it makes it possible to produce in large numbers and with low production costs, infrared cameras having a complexity comparable to those of the detection devices used in visible imaging and with spacings of the elementary detection points of approximately 10 micrometers.

More specifically, the invention relates to a monolithic detection or infrared imaging structure comprising at least one electrically and thermally insulating polymer layer, infrared sensors, which are insulated from one another and have a pyroelectric polymer film, whose face in contact with the insulating layer is equipped with two comb-shaped electrodes, whose teeth are imbricated, the pyroelectric polymer film being polarized in a plane parallel to said face of the film in directions parallel and perpendicular to the teeth of the combs, an integrated circuit having a face in contact with the insulating layer equipped with reading circuits and electrical contact zones completely traversing the insulating layer and connecting the electrodes of each sensor to a reading circuit.

The term insulated sensors is understood to mean sensors which are thermally, mechanically and electrically insulated.

The monolithic structure according to the invention makes it possible to make the maximum use of the pyroelectric properties of the polymers for the industrial production of reliable, solid, infrared detectors, whose complexity is comparable to that of the CCD's used in shooting in the visible range. The angular resolution is then limited by that imposed by the optics associated with the structure and not the opposite as in the prior art.

The electrical and thermal insulating polymer must have a thermal conductivity of $<0.4$ W/(m.K) and a resistivity of $>10^{16} \Omega$.cm.

Electrically and thermally insulating polymers usable according to the invention are polyurethanes, polyesters and polyimides. Preference is given to the use of a polyimide layer. This material is used not only as a result of its known microlithographic properties, but also because of its thermal insulation properties which are never used.

The pyroelectric material can be any type of pyroelectric polymer, such as e.g. polyvinyl polymers, such as polyvinylidene fluoride, known under the abbreviation PVDF.

Preference is given to the use of copolymers of vinylidene fluoride and trifluoroethylene known under the abbreviation VDF-TRFE. Apart from the low cost, these polymers have two major interests:

(a) They are available prior to polymerization in a viscous solution. They can therefore be deposited on an integrated circuit in accordance with the procedure generally used for depositing masking resins in micron technology. The layers can have a thickness which is as small as 100 nm. However, as opposed to other pyroelectric materials, the production of thin layers or films involves no complex and onerous crystallogenesis process.

(b) The spontaneous polarization therein is formed after or during polymerization by imposing in the detector volume an electric field higher than a critical field. In other compounds, the spontaneous polarization is dependent on the crystalline orientation. This orientation requirement makes the crystallogenesis of the thin layers even more complex.

The invention also relates to a process for producing the monolithic structure described hereinbefore and which comprises the following stages:

(a) depositing at least one electrically and thermally insulating polymer layer on the surface of an integrated circuit equipped with reading circuits, followed by polymerization, (b) producing electric contact zones facing the reading circuits and passing through the insulating layer, (c) deposition of a conductive layer on the surface of the insulating layer and contact zones, (d) production of electrode pairs in the conductive layer and which are shaped like combs, said electrodes facing the electric contact zones, the teeth of the electrodes of each pair being imbricated, (e) deposition of a pyroelectric polymer film on the structure obtained in (d), followed by the polymerization of said film, (f) production of a pyroelectric contact element in the pyroelectric film facing each electrode pair and (g) polarization of the contact elements in a plane parallel to the surface of the insulating layer and in directions parallel and perpendicular to the teeth of the combs, each polarized contact element and the pair of electrodes in contact with it constituting an infred sensor.

The process for the production of the structure according to the invention has the advantage of only employing technological steps conventionally used in the production of micron or submicron integrated circuits of the HCMOS type. This technology makes it possible to optimize the thermal performance characteristics of the elementary sensor and to match its impedance to that of the reading circuit, thereby making best use thereof.

Moreover, the spacing of the detector or infrared imaging means, together with the complexity thereof are no longer imposed by hybridization technology. Microlithography used in the invention makes it possible to produce solid infrared vidicons, whose elementary point spacing is approximately 10 micrometers in sensor arrays more particularly having 400 lines of 600 points or dots, compatible with the direct display of the image on a standard television monitor.

Moreover, as the technology of sensors is independent of the technology of the reading circuit, it involves no temperature rise. Moreover, the sensors can be produced on any random known reading circuit and in particular on GaAs or silicon technology circuits, which are the most suitable.

As the orientation of the resultant residual polarization is carried out at the end of the technological process, it can be repeated whenever an accidental event, e.g. an excessive storage temperature has deteriorated said polarization.

The structure according to the invention is monolithic, which naturally eliminates the disadvantage associated with the residue of products used during the technological process and leads to a reliability of the level reached in microelectronics. The life of the detectors and the imaging means using the structure according to the invention is 5 times greater than that of the prior art devices.

Advantageously, the residual polarization of the pyroelectric film is obtained by using the electrodes of the sensors, which ensures the optimum orientation of the residual field in each sensor, no matter what the geometry of the electrodes.

The electrical contact zones can be obtained by etching the insulating or isolating layer, followed by the deposition of a metal layer, according to microelectronic technologies. They can also be obtained either by ion implantation through a mask, making the insulating layer locally conductive, or preferably by a local modification of the electrical properties of the polymer according to a procedure used in organic chemistry and as described in the article entitled "Method for increasing the conductivity of silver-doped polyimides", by A. Auerbach, J. Electrochem. Soc., Apr. 1984, pp 937/8.

These procedures make it possible to obtain contacts with a side length of only 2 micrometers, so that the complete infrared imaging means or detector has a size which could not be obtained by conventional hybridization processes.

Advantageously, the electrodes are produced by depositing a conductive metal coating on the complete structure, masking the regions of said metal coating which it is wished to retain with the aid of a photosensitive resin and then anisotropically etching the metal coating. This microelectronic method makes it possible to bring the electrodes of each sensor as close together as possible, namely less than 1 μm and consequently to maximize the total electrical capacity of the detector or imaging means, whilst retaining an adequate detection volume.

The deposition of the pyroelectric film at the end of the technological process avoids the latter undergoing a temperature rise risking a deterioration of its pyroelectric properties.

The production of infrared sensors by the process according to the invention is much simpler than that of the prior art. Thus, it only requires three instead of six masking levels and the stages are not critical.

BRIEF DESCRIPTION OF THE DRAWINGS

Refer now to the drawings, in which.

DESCRIPTION OF THE PREFERRED EMBODIMENT

For simplification purposes, the following description relates to an infrared detector. For an imaging means, it is merely necessary to complete the structure described by appropriate optics, placed between the detecting part and the radiation and to complete the reading circuits by processing circuits. These modifications are obvious to the Expert in infrared imaging.

Figure 1:
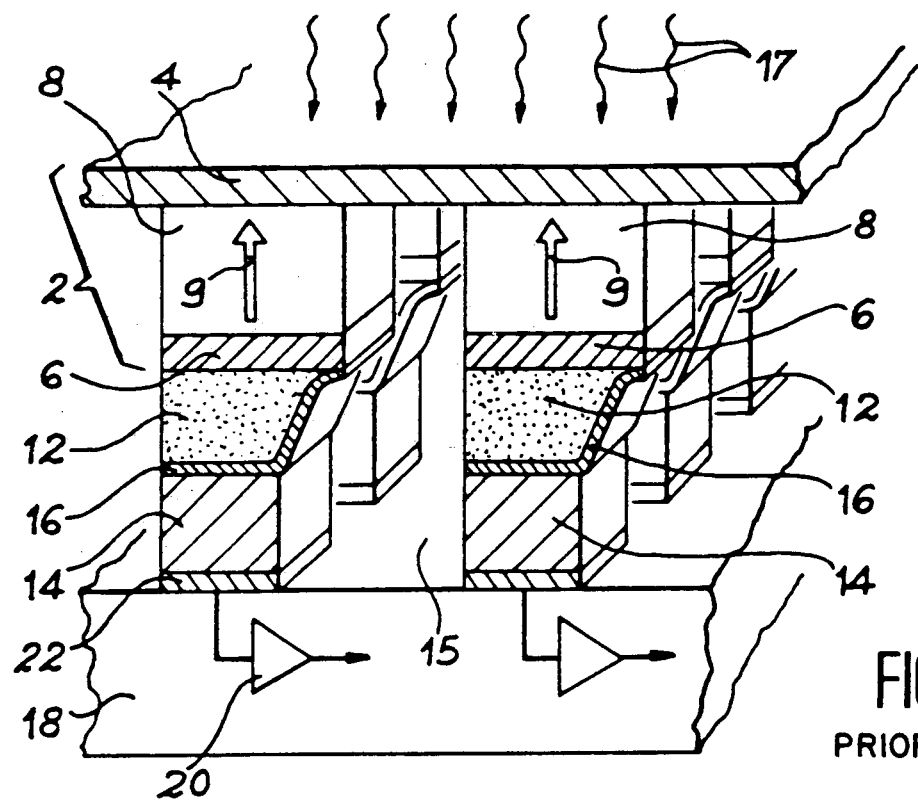
FIG. 1, already described, diagrammatically and in perspective, a first known infrared detector.
Figure 2:
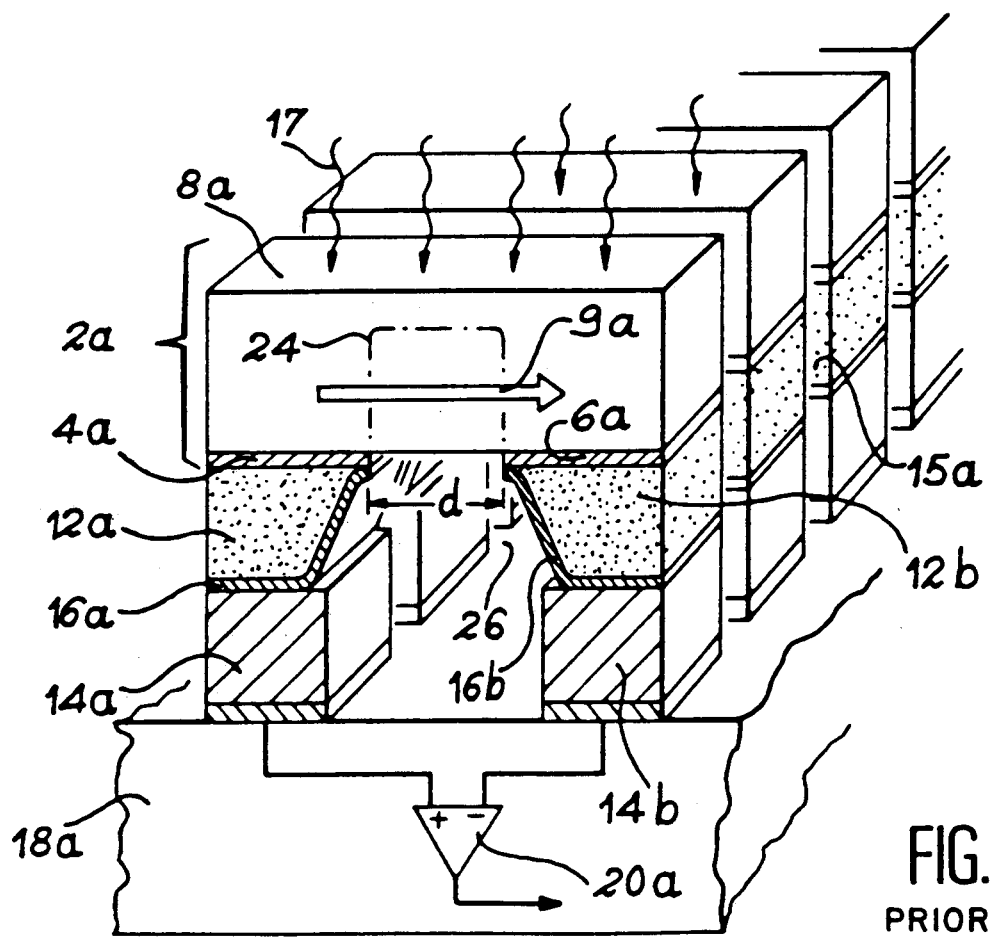
FIG. 2, already described, diagrammatically and in perspective, a second known infrared detector.
Figure 3:
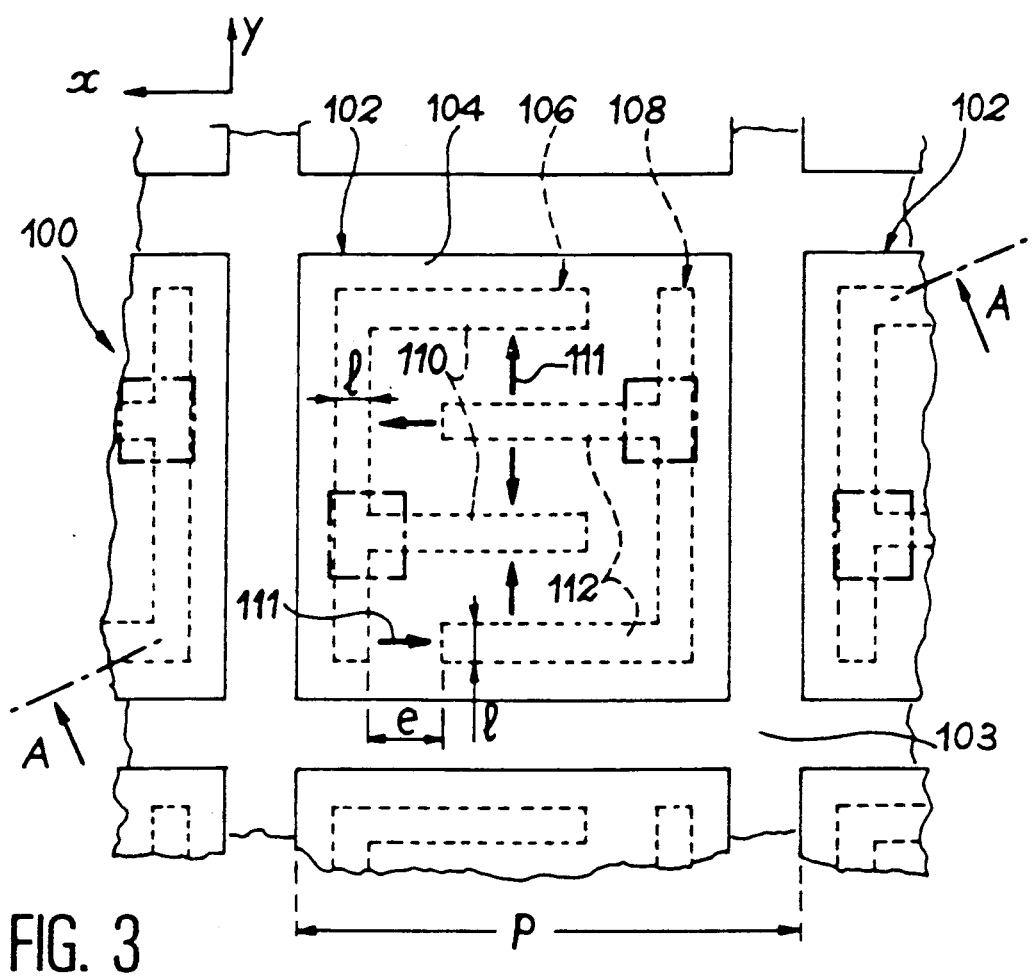
FIG. 3 diagrammatically and in plan view, a monolithic detection structure according to the invention.
Figure 4:
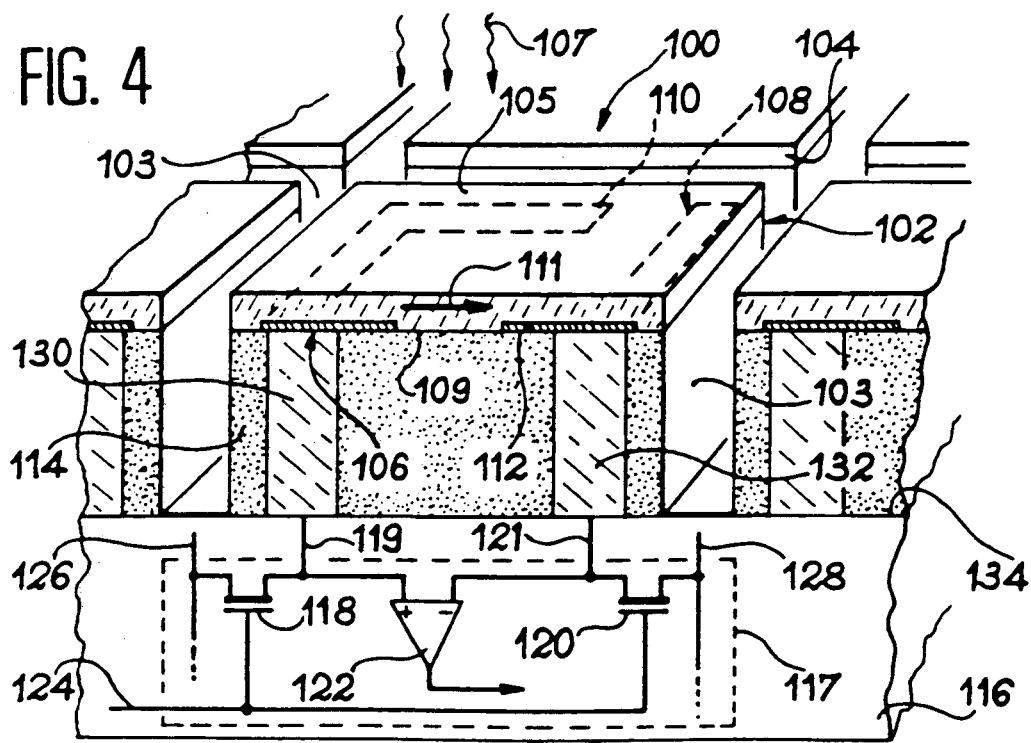
FIG. 4 a perspective view of the structure of FIG. 3.

With reference to FIGS. 3 and 4, the monolithic structure according to the invention comprises an array 100 of infrared sensors 102 with a spacing p, which are electrically, thermally and mechanically insulated or isolated from one another by trenches 103. These sensors 102 have a side dimension of 10 micrometers and the spacing is approximately 12 micrometers. These sensors have in each case a one micrometer thick, polyvinylidene fluoride —$CH_2$—$CF_2$ film 104, whereof the upper face 105 receives the infrared radiation 107 to be detected or used for imaging.

The lower face 109 of film 104 for each sensor 102 is equipped with two electrodes 106, 108, each being shaped like a comb and whose teeth are imbricated. The teeth 110 of electrode 106 penetrate between the teeth 112 of electrode 108. Electrodes 108 and 106 are in particular made from a conductive polymer, such as polyanilines or a metal conventionally used in microelectronics, such as chromium. They have a thickness of 100 nm. The distances e separating the teeth 110 and 112 are 2 micrometers and the width 1 of the electrodes 1 micrometer.

According to the invention, the polarization vector 111 is parallel to the faces 105 and 109 of the film and oriented in direction x parallel to teeth 110, 112 and in direction y perpendicular to said teeth.

Each of the sensors 102 rests on a thermally and electrically insulating polymer block 114, which is in particular polyimide PIQ from E. I. Dupont de Nemours Co. and having a thickness of 5 micrometers.

The insulating blocks 114 rest on an integrated circuit 116 produced using silicon technology and having reading circuits 117. Each reading circuit 117 is associated with a single sensor 102. It has two MOS transistors 118, 120 operating as a switch and connected to a differential amplifier 122.

Transistors 118, 120 are controlled by a control line 124 making it possible to connect the conductive lines 126, 128 respectively to all the electrodes 106, 108 of the elementary points or dots of the array of sensors, via electric contact zones, respectively 130, 132. The electric contact zones associated with each sensor completely tranverse the corresponding polyimide block 114.

The electrical connections between transistors 118 and 120 and respectively the contact zones 130 and 132 are provided by connections 119, 121 of the integrated circuit. The contact surfaces 130, 132 have dimensions 2×2 micrometers.

The reading circuit is shown symbolically and not in the form of technological layers with a view to its simplification. The technological construction of this circuit is well known to the Expert.

Figure 6:
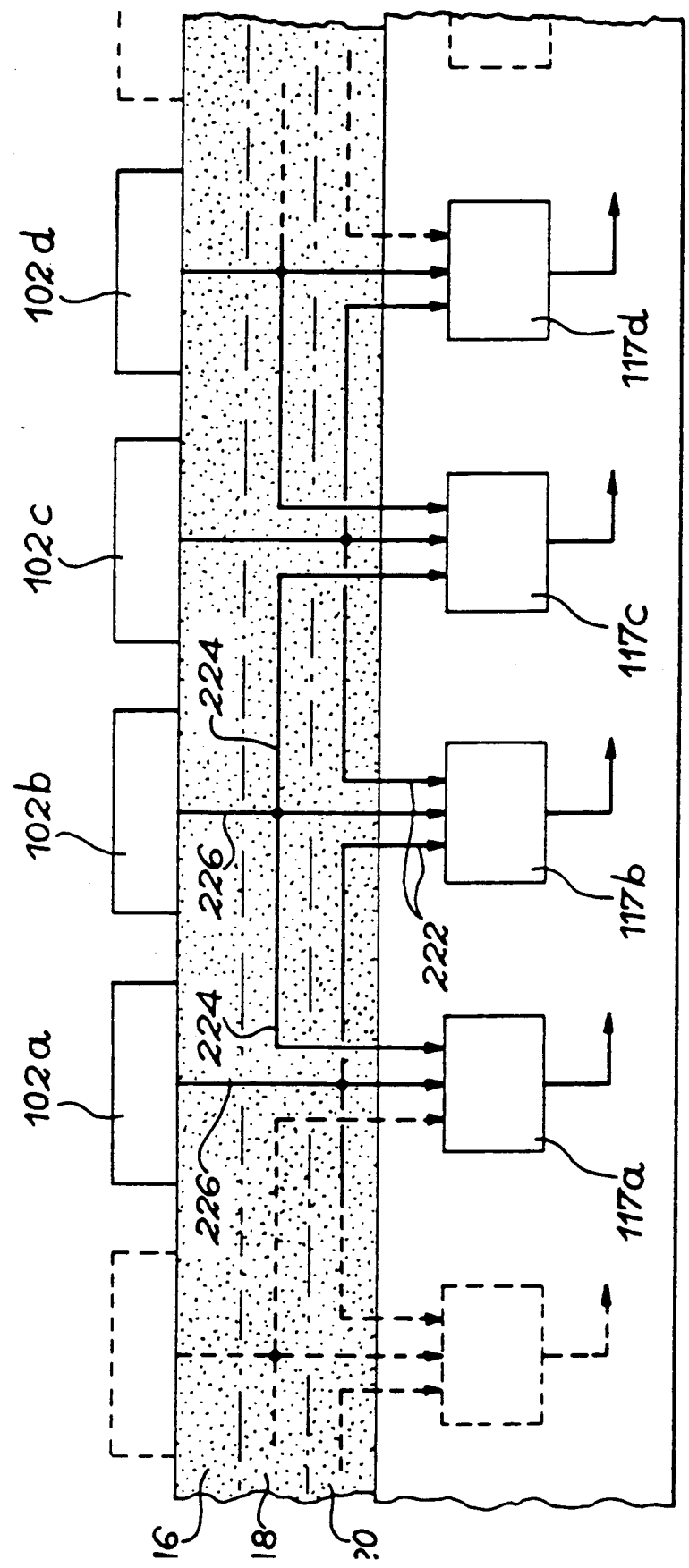

The mechanical, electrical and thermal insulation or isolation trenches 103 of sensors 102 extend up to the upper surface 134 of the integrated circuit 116, although it would be sufficient to have an insulation or isolation solely over the thickness of the pyroelectric material 104 (cf. FIG. 6).

Relative to conventional technology, the density of elementary points in a structure according to the invention is multiplied by 16. Shooting is then limited by the diffraction spot of the optics.

The operation of the structure according to the invention is identical to that described in the prior art.

Figure 5:
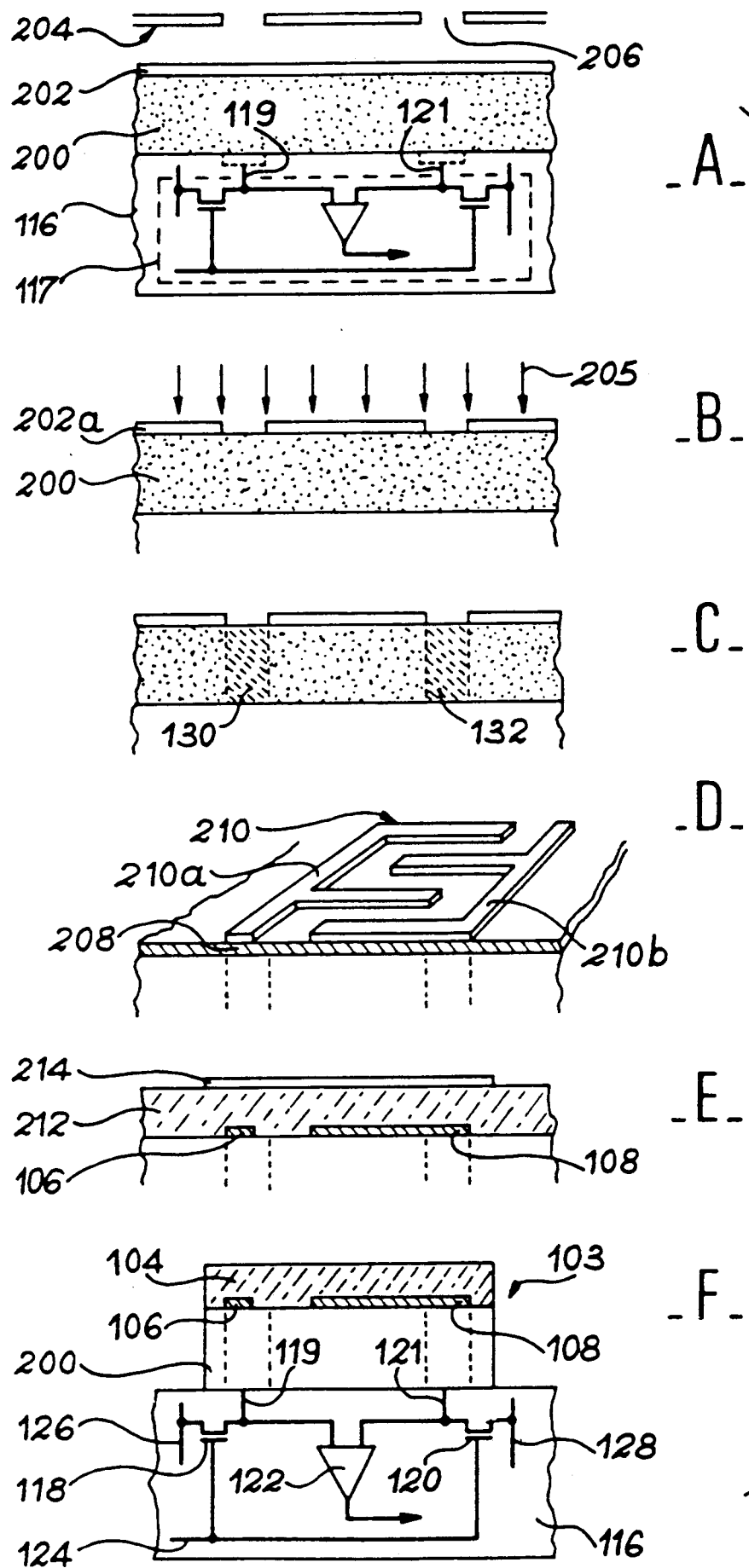
FIG. 5 the different stages of producing the monolithic structure according to the invention, in a plane passing along line A—A in FIG. 3 for parts A-C, E and F and in perspective for part D, FIG. 6 diagrammatically and in section, a device using the structure according to the invention able to carry out certain imaged treatments in the focal plane of the optics associated with the detector.

With reference to FIG. 5, a description will now be given of a first embodiment of the process for producing the structure according to the invention.

After integrating the reading circuits 117 on a silicon substrate by conventional photolithography processes, on the complete integrated circuit 116 is deposited a polyimide layer 200, the polymer standardly used in photolithography. Layer 200 is deposited in accordance with the resin coating method as used for producing photomasks. The thickness of the layer is controlled in such a way as to optimize its thermal leak conductance. It has a thickness of 0.1 to 10 micrometers and is in particular 1 micrometer. The structure obtained is shown in part A of FIG. 5. This is followed by a heat treatment at the temperature prescribed by the supplier for polymerizing the polyimide.

Onto the complete structure is then deposited a photosensitive resin layer 202, like those conventionally used in microelectronics with the layering method. This resin is in particular of type S 1400-27 supplied by SHIPLEY and has a thickness of 1 $\mu$m.

This is followed by an irradiation of the resin layer 202 through a mechanical mask 204 to define the location of the electric contact zones 130, 132 to be produced. The mechanical mask used must be such that its openings 206 face connections 119, 121 of transistors 118, 120 of the reading circuit.

After development in a SHIPLEY developer, the structure obtained in part B is obtained. The irradiated zones of the resin layer 202 have been eliminated. With the aid of this first, thus formed resin mask 202a, the electric contact zones 130, 132 are formed.

Through resin mask 202a is then carried out an ion implantation 205 in the polyimide layer 200, locally making the polyimide conductive (zones 130, 132). This implantation is e.g. carried out with arsenic ions with an energy of 200 KeV and a dose of $10^{20}$ ions/cm$^3$.

This technological stage which has formed 1 $\mu$m of thermal insulant and the zones 130, 132 is repeated five times, so as to obtain a thermal insulant thickness of 5 $\mu$m.

Following implantation, the structure obtained is as shown in part C of FIG. 5.

After eliminating the last resin mask with the aid of an oxygen plasma, in the manner shown in part D of FIG. 5, a conductive layer 208 is deposited, said layer 208 being in particular a chromium layer deposited with a thickness of 100 nm by magnetron sputtering.

As described hereinbefore with reference to part A, this is followed by the formation of a second resin mask 210 defining the location of electrodes 106 and 108 to be produced in layer 208. To this end, mask 210 masks regions of the conductive layer which it is wished to retain and exposes those which it is wished to eliminate.

Mask 210 is in the form of a plurality of combs 210a, 210b, which are combined pairwise and whose teeth are imbricated, in order to obtain the electrodes 106, 108 as shown in FIG. 3.

This is followed by an anisotropic etching of layer 208 with the aid of mask 210. For a chromium layer, use is made of a chlorine-containing plasma as the etching agent. The structure obtained is shown in part E of FIG. 5.

After eliminating mask 210 with the aid of an oxygen plasma, deposition takes place of polyvinylidene fluoride layer 212 using the resin coating method conventionally employed in microelectronics. Its thickness is easily controlled in order to optimize the thermal capacity of the sensors and to adapt it to the heat leak conductance of the polyimide. In particular, layer 212 has a thickness between 0.1 and 10 micrometers and is in particular 1 micrometer. Annealing for 8 h at 80° C. permits a polymerization of the polyvinyl film 212. This polymerization of the pyroelectric film 212 makes it possible to adhere it to the polyimide 200, which prevents deformations thereof.

Then, using conventional photolithography processes (cf. part A of FIG. 5) a third mask 214 is produced defining the dimensions and locations of the sensors 102, as well as their insulation 103. This mask must in particular cover the electrodes 106, 108 of each sensor 102.

With the aid of mask 214, an anisotropic etching of the pyroelectric film 212 takes place using an oxygen plasma. The latter, apart from etching the polyvinyl film 212, ensures the elimination of the resin mask 214, as well as the etching of the polyimide 200. The structure obtained is that shown in part F of FIG. 5.

The final stage of the process consists of polarizing the pyroelectric contact elements 104 obtained by imposing a voltage between the electrodes 108 and 106 of each sensor 102. The circuit used for this polymerization more particularly constitutes part of the integrated circuit 116, which permits the repolarization of the pyroelectric contact elements 104 in case of need.

According to the invention, the voltage necessary for forming the spontaneous polarization 111 (cf. FIG. 3) is collectively applied to the sensors 102 by connecting the electrodes 106 of all the sensors to the control line 126, via MOS switches 118 and connections 119, as well as electrodes 108 to control line 128, via MOS switches 120 and connections 121, for a time determined by the signal applied to line 124 and therefore to the gates of the transistors. This signal is in particular a d.c. voltage of 50 V and is applied for 60 minutes.

The orientation of the resultant residual polarization imposed by the shape of electrodes 106, 108 is spontaneously optimum for reading the pyroelectric voltage due to the use of these electrodes for the polarization of the pyroelectric blocks.

According to a second embodiment of the process according to the invention, the electric contact zones 130 are formed in the manner described in the aforementioned article by A. Auerbach. To this end, the polymer coating to be deposited (part A) on the integrated circuit 116 is constituted by a mixture of polyamic acid and a metal salt, such as silver nitrate dissolved in an organic solvent. The composition of the mixture is as in the prior art. This layer is deposited by the conventional method used for coating resins in microelectronics. Drying the deposited layer makes it possible to eliminate the organic solvent and the polymerization thereof.

The production of the electric contact zones 130, 132 then consists of exposing the deposited polyimide to accelerated carbon particles using the resin mask 205 (part B), in order to locally reduce the silver ions into metal and imidize the polyamic acid. This reduction stage of the silver ions takes place at 360° C.

The matrix shooting structure described with reference to FIGS. 3 and 4 is the simplest which can be envisaged. Thus, each sensor 102 is connected to a single reading circuit 117. However, the inventive process is also suitable for much more complex sensor structures, whose operation is similar to that of the retina of the eye.

FIG. 6 shows in section the structure of a detector able to carry out certain image treatments in the focal plane of an appropriate optics. This detector has several sensors 102a, 102b, 102c and 102d, each connected to three reading circuits. Sensor 102b is connected to reading circuit 117a, 117b and 117c, sensor 102c to reading circuit 117b, 117c, 117d, etc. by means of contact zones similar to zones 130 and 132 in FIG. 4.

In the structure of FIG. 6, the sensors 102a, 102b, 102c and 102d rest on a pile of three polyimide layers 216, 218, 220. These layers are successively deposited on the integrated circuit 116 and are then polymerized.

Following the polymerization of the polyimide layer 220, production takes place of the contact zones 222 traversing the polyimide layer 220. In the same way, following the polymerization of the polyimide layer 218, contact zones 224 are produced, which completely traverse layer 218 and layer 220 and finally, following the polymerization of layer 216, production takes place of the contact zones 226 traversing the three polyimide layers.

By this assembly process devolving from that described hereinbefore, it is possible to retain the thermal insulation linked with the use of the polyimide, while still producing multiple connections linked with the image treatment.

The invention has applications more particularly in the motor vehicle field. In particular, it is suitable for the detection of obstacles on the road, e.g. for preventing multiple collisions under poor visibility conditions.

We claim:

1. A monolithic detection or infrared imaging structure comprising at least one electrically and thermally insulating polymer layer (114, 216, 218, 220), infrared sensors (102, 102a, 102b, 102c, 102d), which are insulated from one another and have a pyroelectric polymer film (104), whose face (109) in contact with the insulating layer (114) is equipped with two comb-shaped electrodes (106, 108), whose teeth (110, 112) are imbricated, the pyroelectric polymer film (104) being polarized (111) in a plane parallel to said face of the film in directions parallel (x) and perpendicular (y) to the teeth of the combs, an integrated circuit (116) having a face (134) in contact with the insulating layer (114) equipped with reading circuits (117, 117a, 117b, 117c, 117d) and electrical contact zones (130, 132, 222, 224, 226) completely traversing the insulating layer and connecting the electrodes (106, 108) of each sensor to a reading circuit (117, 117a, 117b, 117c, 117d).

2. A monolithic structure according to claim 1, characterized in that the insulating layer (114, 216, 218, 220) is a polyimide layer.

3. A monolithic structure according to claim 1, characterized in that the polymer film (104) is a polymer or copolymer of polyvinylidene fluoride.

4. A monolithic structure according to claim 1, characterized in that each reading circuit comprises two MOS transistors (118, 120) operating as a switch and connected to a differential amplifier (122).

5. A monolithic structure according to claim 1, characterized in that it comprises three stacked electrical and thermal insulating layers (216, 218, 220), n sensors (102a-102d), an integrated circuit (116) having n+2 reading circuits (117a-117d) and electric contact zones (222, 224, 226) at least traversing an insulating layer and arranged in such a way that the sensor i, with $1 \leq i \leq n$, is connected to the three reading circuits i, i+1 and i+2.

6. A process for the deposition of a monolithic detection or infrared imaging structure comprising the following stages:
   (a) depositing at least one electrically and thermally insulating polymer layer (210, 216, 218, 220) on the surface of an integrated circuit (116) equipped with reading circuits (117, 117a-117d), followed by polymerization,
   (b) production of electric contact zones (130, 132, 222, 224, 226) facing the reading circuits and passing through the insulating layer,
   (c) deposition of conductive layer (208) on the surface of the insulating layer and contact zones,
   (d) production of electrode pairs (106, 108) in the conductive layer (208) and which are shaped like combs, said electrodes facing the electric contact zones, the teeth (110, 112) of the electrodes of each pair being imbricated,
   (e) deposition of a pyroelectric polymer film (212) on the structure obtained in (d), followed by the polymerization of said film,
   (f) production of a pyroelectric contact element (104) in the pyroelectric film facing each electrode pair and
   (g) polarization (111) of the contact elements in a plane parallel to the surface of the insulating layer and in directions parallel (x) and perpendicular (y) to the teeth (110, 112) of the combs, each polarized contact element and the pair of electrodes in contact with it constituting an infrared sensor (102, 102a-102d).

7. The process according to claim 6, characterized in that the insulating layer is a polyimide layer.

8. The process according to claim 7, characterized in that the contact zones are formed in the insulating layer (200, 220, 222, 224) by local chemical modification of said layer.

9. The process according to claim 6, characterized in that the pyroelectric film (214) is of polyvinylidene fluoride.

10. The process accordin to claim 6, characterized in that the pyroelectric contact elements are simultaneously polarized by using the electrodes (106, 108) of each sensor to carry the polarization signal.

11. The process according to claim 6, characterized in that the electrodes (106, 108) are formed by anisotropic etching of the conductive layer (208) using an appropriately shaped etching mask (210).

12. The process according to claim 6, characterized in that the polymer elements are formed by anisotropic etching of the polymer film (200) using an appropriately shaped etching mask (202a).

* * * * *